US006239765B1

United States Patent
Johnson et al.

(10) Patent No.: US 6,239,765 B1
(45) Date of Patent: May 29, 2001

(54) ASYMMETRIC DIPOLE ANTENNA ASSEMBLY

(75) Inventors: Greg F. Johnson, Aptos; Robert Hill, Salinas, both of CA (US); Don Keilen, Sparks, NV (US)

(73) Assignee: RangeStar Wireless, Inc., Aptos, CA (US)

(*) Notice: Subject to any disclaimer, the term of this patent is extended or adjusted under 35 U.S.C. 154(b) by 0 days.

(21) Appl. No.: 09/382,179

(22) Filed: Aug. 24, 1999

Related U.S. Application Data (60) Provisional application No. 60/121,989, filed on Feb. 27, 1999.

(51) Int. Cl.[7] .................................................. H01Q 1/38
(52) U.S. Cl. ........................... 343/795; 343/793; 343/702
(58) Field of Search ..................................... 343/795, 793, 343/700 MS, 702, 806

(56) References Cited

U.S. PATENT DOCUMENTS

| 4,686,536 | * | 8/1987 | Allock | 343/700 MS |
| 5,539,414 | * | 7/1996 | Keen | 343/700 MS |
| 5,764,197 | * | 6/1998 | Tsuru et al. | 343/895 |
| 5,767,811 | * | 6/1998 | Mandai et al. | 343/702 |
| 5,798,737 | * | 8/1998 | Kanaba et al. | 343/895 |
| 5,918,189 | * | 6/1999 | Kivela | 455/575 |
| 6,107,967 | * | 8/2000 | Hill | 343/702 |
| B1 6,181,283 | * | 1/2001 | Johnson et al. | 343/702 |

* cited by examiner

Primary Examiner—Hoanganh Le
Assistant Examiner—Ephrem Alemu
(74) Attorney, Agent, or Firm—Larkin, Hoffman, Daly & Lindgren, Ltd.

(57) ABSTRACT

An asymmetric dipole antenna assembly is provided for wireless communications devices, and includes separate upper and lower conductor traces and a low impedance feedpoint at the junction of the conductor traces. The upper conductor trace may include a matching network and may be printed on a planar printed circuit board mounted proximate the top of the a hand-held wireless transceiver. The upper conducting trace provides ¼ wave resonance over a desired frequency range and a 50 ohm input impedance for the antenna. The lower conductor trace may be provided by the ground trace of the wireless device circuitry, requiring only a minimum effective trace length of ¼ wavelength at the lowest frequency of operation. Polarization of the antenna is determined by the orientation of the longest dimension of the lower conductor.

34 Claims, 6 Drawing Sheets

ASYMMETRIC DIPOLE ANTENNA ASSEMBLY

CROSS REFERENCE TO RELATED APPLICATION

This application claims the benefit of priority pursuant to 35 USC §119(e)(1) from the provisional patent application filed pursuant to 35 USC §111(b): as Ser. No. 60/121,989 on Feb. 27, 1999, which disclosure is incorporated herein.

FIELD OF THE INVENTION

The present invention relates to an antenna assembly for a wireless communication devices, such as a cellular telephone. Particularly, the present invention relates to a compact asymmetric dipole antenna assembly. Still further, the present invention relates to an antenna assembly effective over two or more resonance frequency bands.

BACKGROUND OF THE INVENTION

Known wireless communications devices such as handheld cellphones and data modems (LANs) typically are equipped with an external wire antenna (whip), which may be fixed or telescoping. Such antennas are inconvenient and susceptible to damage or breakage. The overall size of the wire antenna is relatively large in order to provide optimum signal characteristics. Furthermore, a dedicated mounting means and location for the wire antenna are required to be fixed relatively early in the engineering process. Several antenna assemblies are known, and include:

Quarter Wave Straight Wire

This is a ¼ wavelength external antenna element, which operates as one side of a half-wave dipole. The other side of the dipole is provided by the ground traces of the transceiver's printed wiring board (PWB). The external ¼ wave element may be installed permanently at the top of the transceiver housing or may be threaded into place. The ¼ wave element may also be telescopically received into the transceiver housing to minimize size. The ¼ wave straight wire adds from 3–6 inches to the overall length of an operating transceiver.

Coiled Quarter Wave Wire

An external small diameter coil that exhibits ¼ wave resonance, and which is fed against the ground traces of the transceiver's PWB to form an assymetric dipole. The coil may be contained in a molded member protruding from the top of the transceiver housing. A telescoping ¼ wave straight wire may also pass through the coil, such that the wire and coil are both connected when the wire is extended, and just the coil is connected when the wire is telescoped down. The transceiver overall length is typically increased by ¾–1 inch by the coil.

Planar Inverted F Antenna (PIFA)

Consists of an external conducting plate which exhibits ¼ wave resonance, and is fed against the ground traces of the PWB of a transceiver to form an asymmetric dipole. The plate is usually installed on the back panel or side panel of a transceiver and adds to the overall volume of the device.

Patch

Typically consists of a planar dielectric material having a resonant structure on one major surface of the dielectric and a second ground plane structure disposed on the opposite major surface. A post may electrically couple (through the dielectric) the resonant structure to a coaxial feedline.

Additionally, there have been numerous efforts in the past to provide an antenna inside a portable radio communication device. Such efforts have sought at least to reduce the need to have an external whip antenna because of the inconvenience of handling and carrying such a unit with the external antenna extended.

SUMMARY OF THE INVENTION

The present invention replaces the external wire antenna of a wireless communication device with a planar conformal element which is installed within the housing of a wireless device and closely-spaced to the printed circuit board and antenna feedpoint of the wireless device. Electrical connection to the wireless device's main PWB may be achieved through automated production equipment, resulting in cost effective assembly and production. Electrical performance of the internal (embedded) antenna in wireless systems is nominally equal to that of a conventional wire antenna.

It is an object of the present invention to provide an antenna assembly which can resolve the above shortcomings of conventional antennas. Additional objects of the present invention include: the elimination of the external antenna and its attendant faults such as susceptibility to breakage and impact on overall length of the transceiver; the provision of an internal antenna that can easily fit inside the housing of a wireless transceiver such as a cellphone, with minimal impact on its length and volume; the provision of a cost effective antenna for a wireless transceiver, having electrical performance comparable to existing antenna types; and, the reduction in SAR (specific absorption rate) of the antenna assembly, as the antenna exhibits reduced transmit field strength in the direction of the user's ear for hand held transceivers such as a cellular telephone, when compared to the field strength associated with an external wire type antenna system.

The present invention provides an antenna assembly including a first planar element having a conductive trace, and at least one conductive member disposed near the first element to jointly form an asymmetrical dipole antenna. The resonant frequency range of the dipole is primarily determined by the dimensions of the conductive trace on the first planar element, which may be selected to exhibit ¼ wave resonance. The elongate second element has a minimum electrical length dimension of ¼ wavelength at the lowest frequency of operation, and may consist solely of the ground traces of the printed wiring board(s) of a wireless transceiver such as a cellular telephone.

In the preferred embodiment the first printed circuit element is rectangular having a thickness in the range 0.010–0.125 inches. Alternatively, the conductive traces may be printed on any number of conventional dielectric materials having a low to moderate dielectric loss such as plastics and fiberglass. Furthermore, the rectangular size of the first element may conform to available volume in the housing of a wireless transceiver such as a cellular telephone. The antenna assembly may be excited or fed with 50 ohm impedance, which is a known convenient impedance level found at the receiver input/transmitter output of a typical wireless transceiver.

In a preferred embodiment, the antenna assembly includes a matching network defined between a shorted end of the printed conducting trace (shorted to the second elongate conductor element (ground plane)) and a tap point further along the trace which results in a 50 ohm impedance referenced to a nearby point on the elongate conductor element. This feed system makes possible very close spacing between the first and second planar elements of the asymmetric dipole antenna, which minimizes the volume required when integrating the antenna into a wireless transceiver. Spacing on the order of 0.007 wavelength at the lowest frequency of operation between the elements is typically achieved in this manner. The spacing required without this matching system is typically 0.021 wavelength. The printed circuit element(s) of this invention are functional without the matching network, but may require increased spacing from the conductor element.

BRIEF DESCRIPTION OF THE DRAWINGS

The above set forth and other features of the invention are made more apparent in the following Detailed Description of the Preferred Embodiments when read in conjunction with the attached drawings, wherein.

DETAILED DESCRIPTION OF PREFERRED EMBODIMENTS

Referring now to the drawings, wherein like numerals depict like parts throughout, preferred embodiments of an antenna assembly 20 according to the present invention are illustrated in FIGS. 1–12. The antenna assembly 20 may implemented within single or multiple frequency wireless communication devices, for instance devices operating over the GPS (1575 MHz), cellular telephone (824–890 MHz and 860–890 MHz), PCS device (1710–1880 MHz, 1750–1870 MHz, and 1850–1990 MHz), cordless telephone (902–928 MHz), or BLUETOOTH™ specification (2.4–2.5 GHz.) frequency ranges. Those skilled in the relevant arts may appreciate that principles of the present invention are equally applicable for antenna assemblies operating at alternative frequency ranges. In alternative embodiments, the dimensions of the antenna assembly 20 may be scaled in proportion to provide operation at other frequencies, including frequencies in the 800 MHz. to 3,000 MHz. range. Such modifications are considered within the scope of the applicant's claims.

Figure 1:
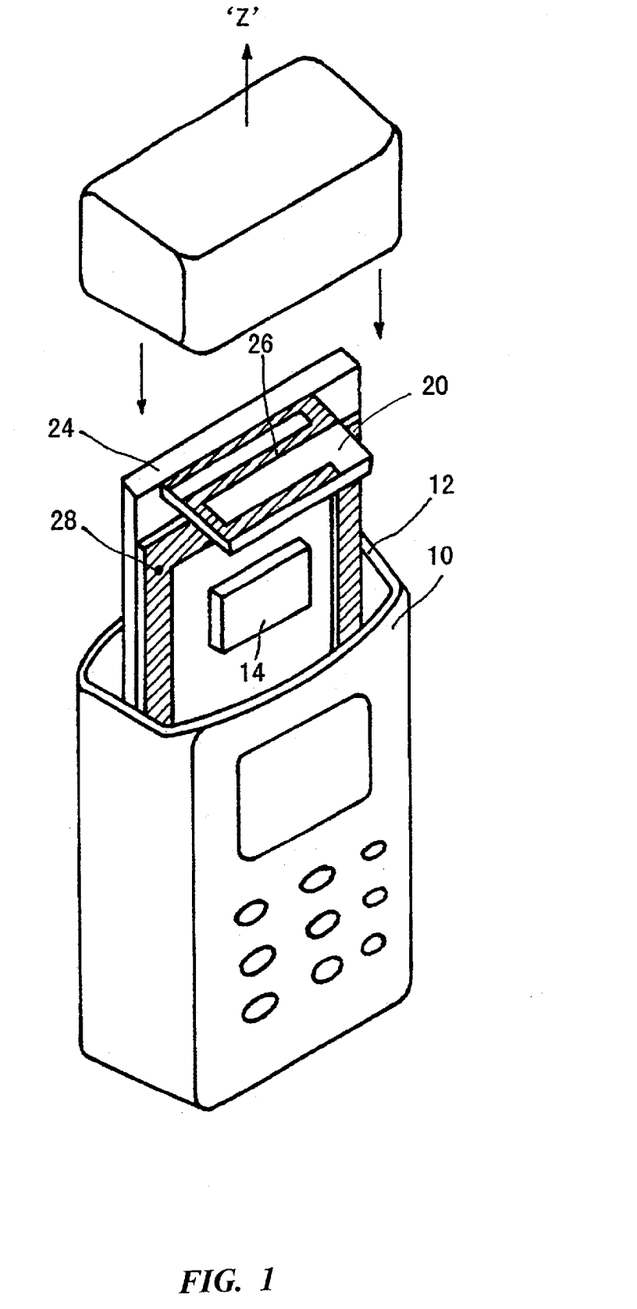
FIG. 1 is an exploded perspective view of a wireless communication device incorporating an antenna assembly according to the present invention.

FIG. 1 illustrates an antenna assembly 20 disposed within a wireless communication device, such as a cellular telephone 10. The antenna assembly 20, disposed near the upper portion of the device 10 (away from the user's hand during operation), is received and incorporated within the housing 12 of the device 10. Although the antenna assembly 20 can be installed in locations within or external to the housing 12, it is presently preferred that it be disposed within the housing 12. Wireless communication device 10 contains electrical apparatus, such as a receiver and/or transmitter, herein referred for convenience together as a transceiver component 14.

Figure 2:
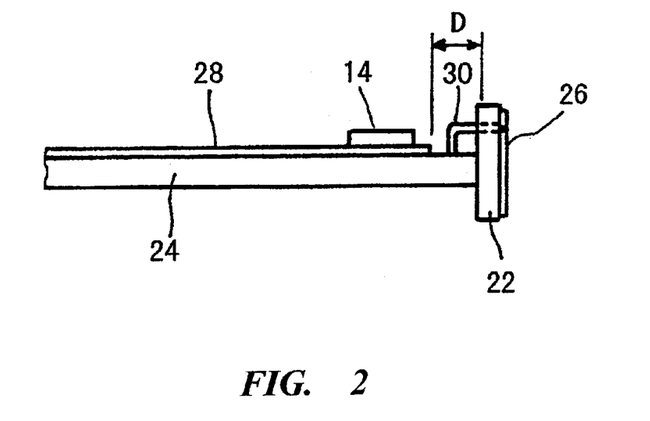
FIG. 2 illustrates a side elevation view of an antenna assembly of the present invention.
Figure 3:
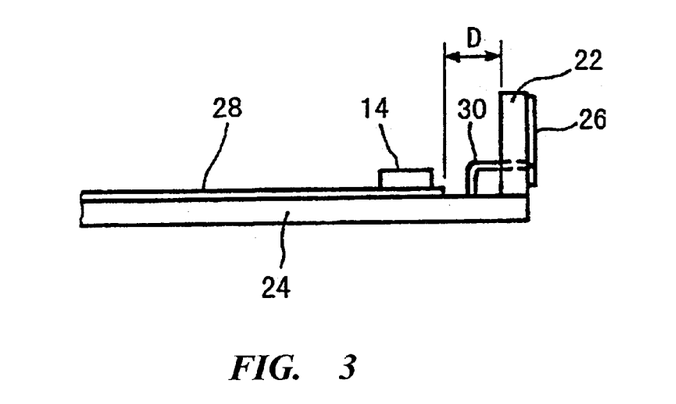
FIG. 3 illustrates a side elevational view of another embodiment of an antenna assembly of the present invention.

Referring also to FIGS. 2–3, the antenna assembly 20 includes first and second planar elements 22, 24 disposed in substantially perpendicular relationship. A first conductor trace 26 is disposed upon the first planar element 22, and a second conductor trace 28 is disposed upon the second planar element 24. The first conductor trace 26 is operatively coupled to the transceiver signal input/output componentry 14 via connection 30. The first conductor trace 26 is disposed upon a major surface of the first planar element 22 and directed in a direction 'Z" away from the second conductor trace 28.

The first and second conductor traces 26, 28 of the antenna assembly 20 are disposed upon respective first and second planar elements 22, 24, which may be a printed wiring boards (PWB) or similar materials capable of supporting the conductor traces. The meandering first conductor trace 26 has a length dimension which is substantially larger than the dimensions of the first planar element 22. Preferably, the second conductor trace 28 is the printed ground plane circuit of the transceiver 14. Both the first and second conductor traces 26, 28 may be disposed upon respective PWB using known circuit fabrication techniques, such as surface printing, photolithography, and etching processes. The first planar element 22 and/or the second planar element 24 may be configured to conform to a portion of the housing 12, for example to assume a convex or more complex form. Those skilled in the arts will appreciate that the design and selection of either the first or second planar elements 22,24 with reference to a particular wireless communication device may result in such complex shapes.

FIGS. 2 and 3 illustrate embodiments of the antenna assembly 20 wherein the first planar element 22 is substantially perpendicular to the second planar element 24. The isolation distance 'D' between the ground plane (23) of the transceiver 14 and the first planar element 22 is approximately 3 millimeters (or approximately 0.007 λ at 900 MHz.). In FIG. 2, portions of the first planar element 22 are disposed relative both major surfaces of the second planar element 24 (a "T" shaped configuration), as opposed to FIG. 3, where the first planar element 22 extends from one major surface of the second planar element 24 (an "L" shaped configuration).

Figure 4:
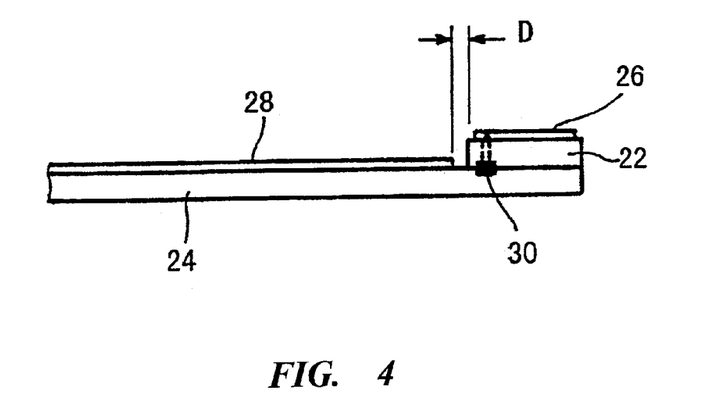
FIG. 4 illustrates a side elevational view of yet another embodiment of an antenna assembly of the present invention.

FIG. 4 illustrates another embodiment of the antenna assembly 20 wherein the first and second planar elements 22, 24 are disposed in parallel orientation. The isolation distance 'D' is approximately 1 millimeter (at 900 MHz.). The first conductive trace 26 may be operatively coupled to the transceiver 14 through known surface mount interconnections 30.

Figure 5:
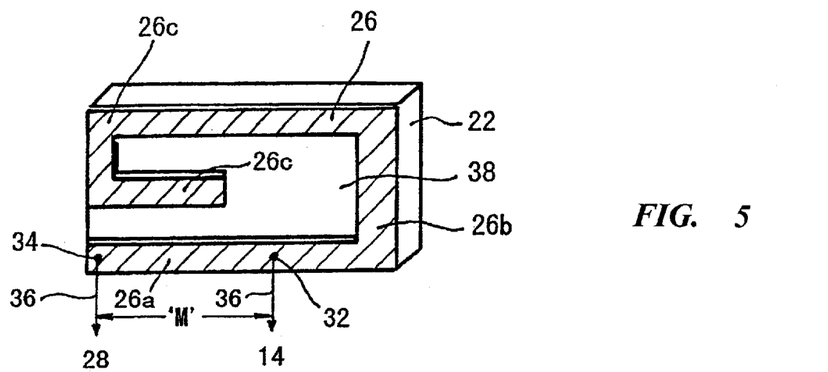
FIG. 5 illustrates a portion of the antenna assembly of FIGS. 1–4 and shows the matching network, resonant portion, and electrical connection feedpoints for a single-band planar printed circuit antenna element/half dipole.

FIG. 5 illustrates the first planar element 22 and first conductor trace 26 of the embodiment of FIGS. 1–4. The conductor trace 26 is disposed upon a single major surface of the first planar element 22 and is operatively coupled to the transceiver electronics 14 of the second planar element 24 via a feedpoint 32. One end 34 of the conductive trace 26 is coupled to the second conductive trace 28 (the ground plane of the second planar element 24) via leads 36 or other electrical connection. A length of ends 36 should preferably be minimized. A distance 'M' further along the conductive trace 24, the feedpoint connection 32 is made between the first conductive trace 26 and the transceiver electronics 14 of the second planar element 24. The connections between the ground plane 24 and signal feed 32 may be achieved via plated through-holes in the first planar element 22.

The region of the first conductor trace 26 between the ground connection 34 and the feedpoint 32 (the distance 'M' ) functionally operates a matching network to effect an approximate 50 ohm feedpoint. A 50 ohm feedpoint is thus defined across feedpoint 32 and ground trace 28. The matching network length 'M' is approximately 0.03 λ (λ: a wavelength within the range of antenna operating frequencies).

Still referring to FIG. 5, the first planar element 22 may be a printed wiring board or similar dielectric material having a range of thickness between 0.01 and 0.062 inches, for example. The first conductive trace 26 is disposed at the periphery of the first planar element 22 away from a central region 38. The first conductive trace 26 includes variable width traces 26a, b, c with antenna broadband operational characteristics being a function of trace widths.

Figure 6:
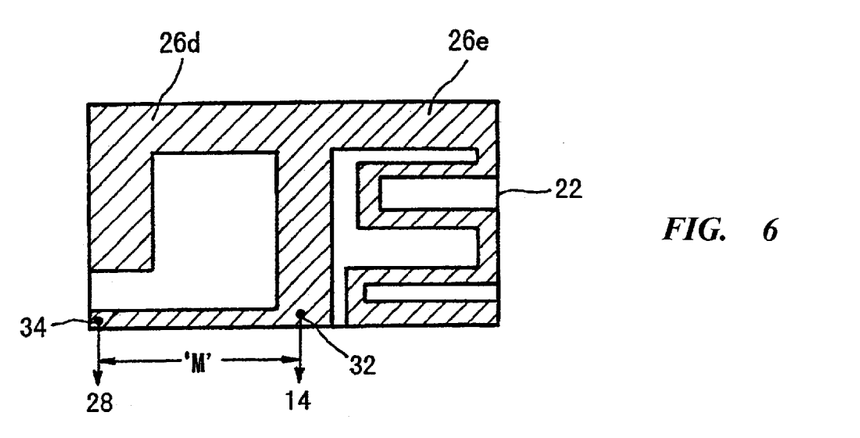
FIG. 6 illustrates a front elevational view of a dual band antenna assembly according to the present invention.
Figure 7:
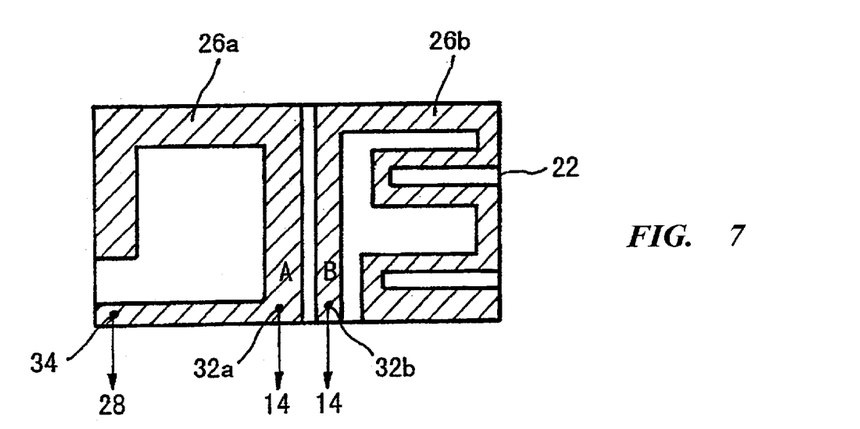
FIG. 7 illustrates a front elevational view of a dual band antenna assembly according to the present invention.

FIG. 6 illustrates another embodiment of the present invention which functions across a pair of frequency bands for dual band transceiver devices. The first conductive trace 26 includes both a high- and low-frequency band resonant portion 26d, e. The first conductive trace 26 is coupled to the ground plane of the second planar element 24 at location 34 and coupled to the signal generating circuit 14 at single feed point 32. FIG. 7, in comparison, includes a pair of feedpoints 32a, b between the first conductive trace 26 and the transceiver electronics 14. The feedpoint 32a is for high frequency band, while the feedpoint 32b is for a lower frequency band. A ground connection is not required for the high frequency portion.

Figure 8:
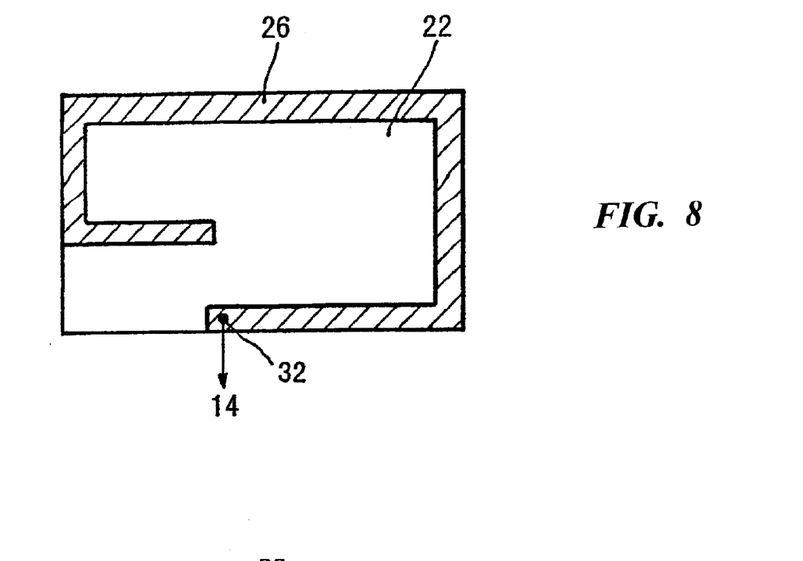
FIG. 8 illustrates a front elevational view of another antenna assembly according to the present invention without impedance matching circuit.

FIG. 8 illustrates another embodiment of the present invention. A simplified first conductive trace element 26 is disposed upon the first planar element 22 without a matching network as in the embodiments of FIGS. 1–7. Embodiments of FIGS. 1–7 may also employ this feed method, however the isolation distance "D" may increase.

Figure 9:
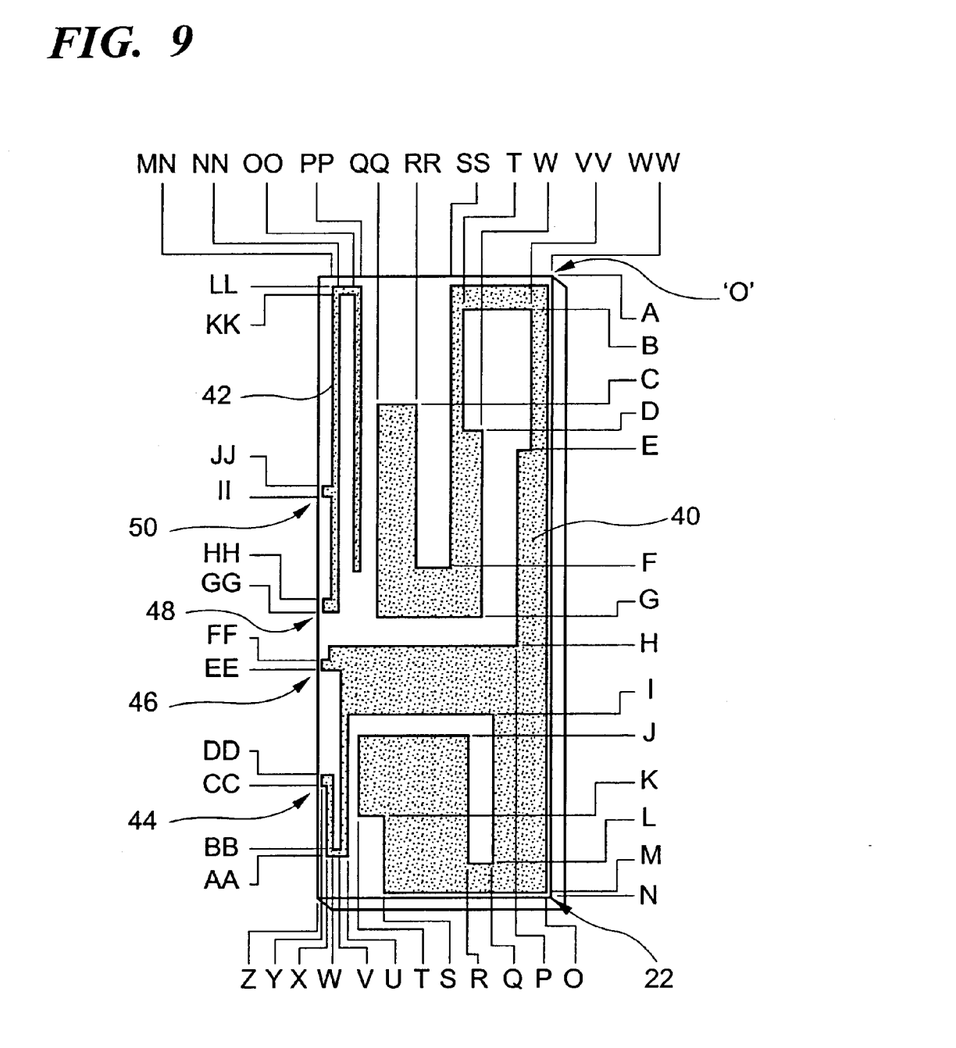
FIG. 9 illustrates a front elevational view of a tri-band antenna assembly according to the present invention.
Figure 10:
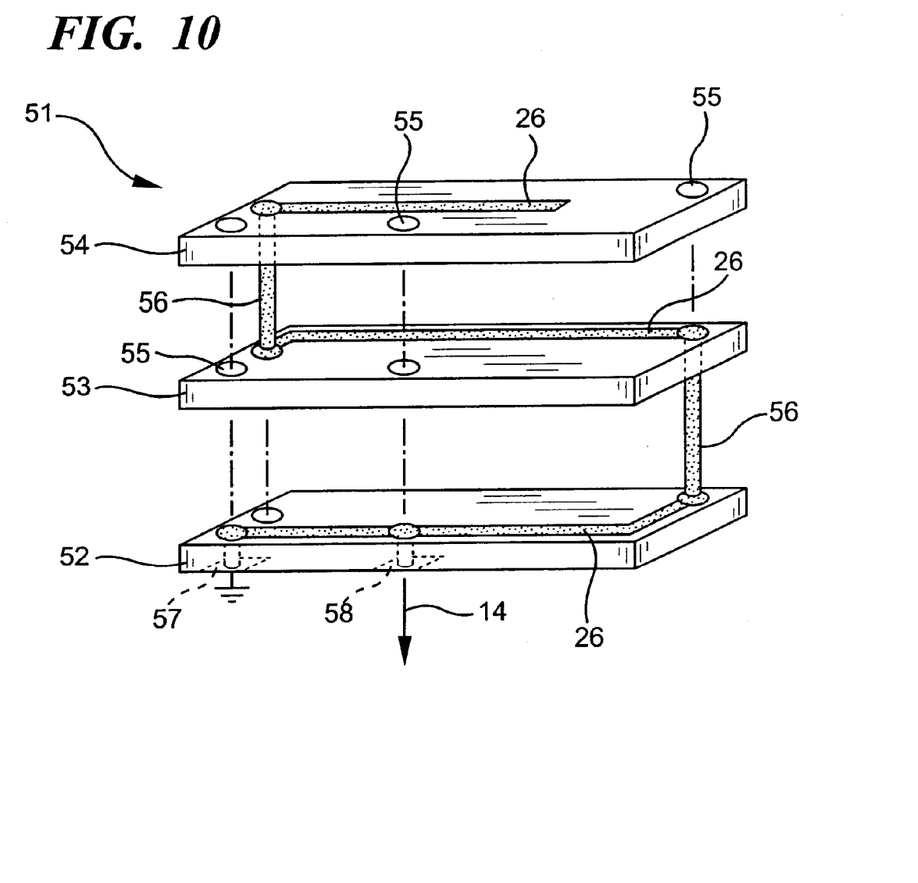
FIG. 10 illustrates an exploded perspective view of another antenna assembly according to the present invention.

FIG. 9 illustrates another embodiment of the present invention. The antenna assembly of FIG. 9 depicts a tri-band antenna assembly 20 functioning across a cellular band (880–960 MHz.), a PCS band (1710–1880 MHz.) and the BLUETOOTH™ band (2.4–2.5 GHz.). Cellular and PCS band operation is effected through first conductor trace 40. BLUETOOTH™ band operation is effected through conductor trace 42. Conductor trace 40 is coupled to ground of the second planar element at point 44 and to the signal generating circuitry 14 via feedpoint 46. Conductor trace 42 is coupled to ground of the second planar element 24 at point 48 and to the appropriate signal generating circuitry via feedpoint 50. Dimensions for preferred embodiments of the antenna assembly of FIG. 10 are included in Table 1. Horizontal and vertical dimensions are measured with respect to origin point 'O'.

TABLE 1

| Position | Distance from Origin Point 'O' (Inches) |
|---|---|
| A | 0.000 |
| B | .075–1.905 |
| C | .305–7.747 |
| D | .365–9.271 |
| E | .415–10.541 |
| F | .703–17.856 |
| G | .820–20.828 |
| H | .885–22.479 |
| I | 1.048–26.619 |
| J | 1.080–27.432 |
| K | 1.300–33.020 |
| L | 1.415–35.941 |
| M | 1.485–37.719 |
| N | 1.500–38.100 |
| O | .015–.381 |

TABLE 1-continued

| Position | Distance from Origin Point 'O' (Inches) |
|---|---|
| P | .105–2.667 |
| Q | .151–3.835 |
| R | .216–5.486 |
| S | .422–10.719 |
| T | .484–12.294 |
| U | .529–13.437 |
| V | .544–13.818 |
| W | .559–14.199 |
| X | .574–14.580 |
| Y | .585–14.860 |
| Z | .600–15.240 |
| AA | 1.400–35.560 |
| BB | 1.385–35.179 |
| CC | 1.227–31.166 |
| DD | 1.202–30.531 |
| EE | .953–24.206 |
| FF | .928–23.571 |
| GG | .807–20.500 |
| HH | .782–19.863 |
| II | .532–13.513 |
| JJ | .507–12.878 |
| KK | .040–1.016 |
| LL | .015–.381 |
| MM | .560–14.224 |
| NN | .545–13.843 |
| OO | .515–13.081 |
| PP | .500–12.700 |
| QQ | .450–11.430 |
| RR | .360–9.144 |
| SS | .280–7.112 |
| TT | .245–6.223 |
| UU | .193–4.902 |
| VV | .075–1.905 |
| WW | 0.000 |

Figure 11:
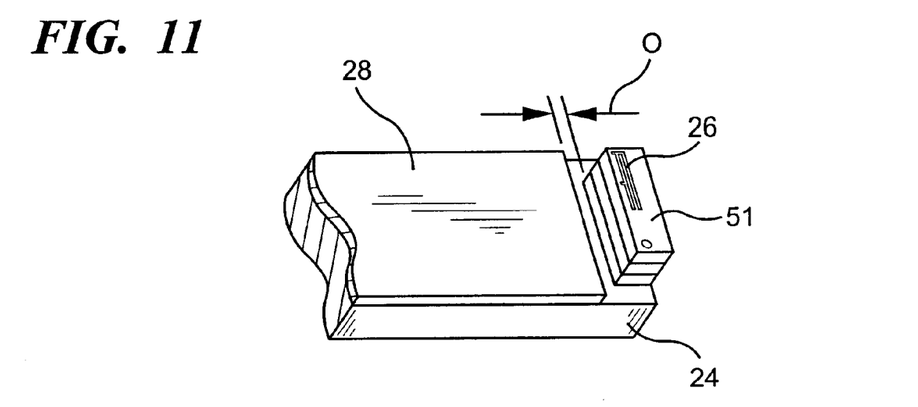
FIG. 11 illustrates a perspective view of the antenna assembly of FIG. 10.

FIGS. 10–11 illustrate another embodiment of an antenna assembly according to the present invention. FIG. 10 shows an exploded view, and FIG. 11 illustrates an assembled perspective view with the first antenna element 51 disposed upon a second planar element 24. First antenna element 51 consists of three substantially identical dielectric sections 52–54 which are disposed upon each other in a laminated or superimposed fashion. Electrical connection between conductor traces 26 disposed upon the dielectric sections 52–54 are made through plated through holes and associated conductors 56. The assembly 51 may be surface mounted to one side of the planar element 24 via the mounting pad 57 to the circuit ground trace 28 and via mounting pad 58 to the circuit signal input/output 14. The isolation distance "D" between the assembly (51) and the ground plane (28) may be reduced to less than 1 mm. Overall dimensions (height× width×length) for operation over 824–894 MHz are approximately 6 mm×4.5 mm×38 mm.

Figure 12:
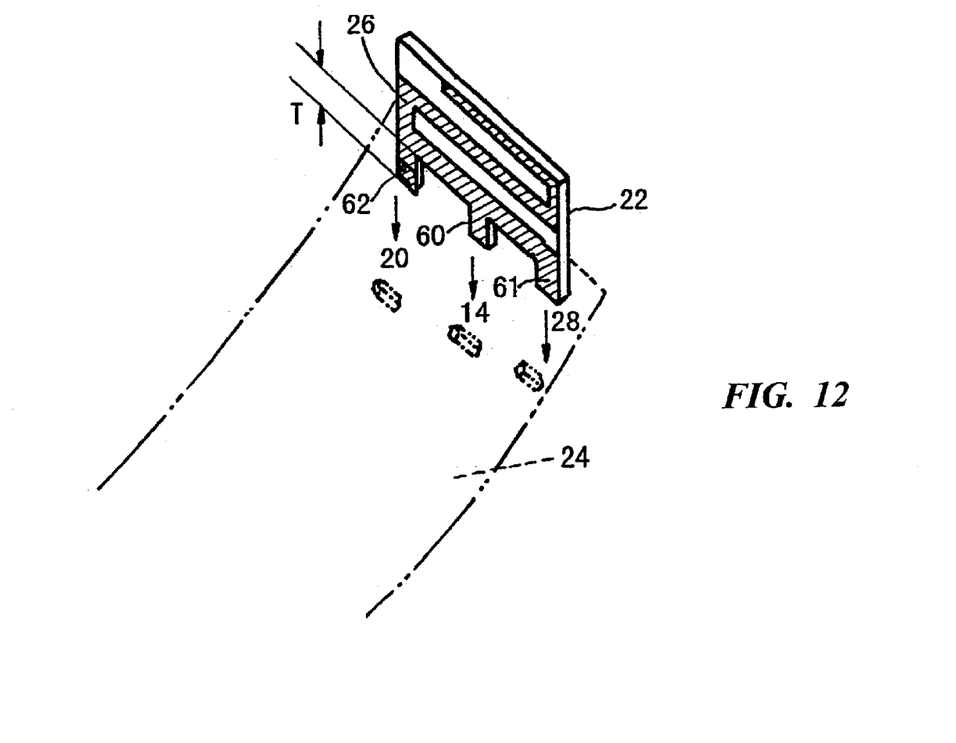
FIG. 12 illustrates yet another embodiment of an antenna assembly according to the present invention.

FIG. 12 illustrates another embodiment of the first planar element of present invention which is adapted to be secured relative the second planar element via mounting tabs 60–62. These tabs 60–62 are sized to be received into corresponding elements on the second planar element. A dimension "T" is chosen to be greater than or equal to the thickness of the printed wiring board. Connections are made to transceiver circuitry 14 at tab 60 and 61. Tab 62 is partially metallized and provides mechanical support for the first planar element 22. Tabs 60, 61, 62 thus provide both mechanical and electrical connection between the first planar element 22 and the second planar element 24. Connections may be made through known fabrication techniques, including solder reflow processes and other high volume production techniques.

Although the invention has been described in connection with particular embodiments thereof other embodiments, applications, and modifications thereof which will be obvi-

We claim:

1. An asymmetric dipole antenna assembly for a communications device operating at a predetermined wavelength and having a transceiver circuit including a signal output and a ground plane, said antenna assembly comprising:

a first dipole half including a first conductor trace disposed upon a first dielectric substrate, said first conductor trace having a first end and a one-quarter wavelength electrical length; and a second dipole half including a second conductor trace disposed upon a second dielectric substrate, said second conductor trace being operatively coupled to the ground plane of the transceiver circuit;

said first conductor trace being operatively coupled proximate said first end to the ground plane of the transceiver circuit;

said first conductor trace being operatively coupled to the transceiver circuit signal output at a predetermined distance away from the first end; and said first conductor trace being disposed a predetermined isolation distance away from the second conductor trace.

2. An asymmetric dipole antenna assembly according to claim 1, wherein the predetermined isolation distance is approximately zero.

3. An asymmetric dipole antenna assembly according to claim 1, wherein the predetermined isolation distance is less than 0.03 times the predetermined wavelength.

4. An asymmetric dipole antenna assembly according to claim 1, wherein the first conductor trace includes first conductor element portions having different widths.

5. An asymmetric dipole antenna assembly according to claim 1, wherein the first conductor trace is disposed upon a major surface of the first dielectric substrate directed away from the transceiver circuit.

6. An asymmetric dipole antenna assembly according to claim 1, wherein the first dielectric substrate is approximately parallel with the second dielectric substrate.

7. An asymmetric dipole antenna assembly according to claim 1, wherein the first dielectric substrate is disposed proximate an upper portion of the communications device and away from a user's hand during normal operation.

8. An asymmetric dipole antenna assembly according to claim 1, wherein the signal output includes two different frequency bands of signal information, and wherein separate portions of the first conductor trace radiate within the different two frequency bands during operation.

9. An asymmetric dipole antenna assembly according to claim 8, wherein the two different frequency bands are selected from among the group containing: 860–980 MHz and 1750–1870 Mhz; 824–890 MHz and 1850–1990 MHz; and, 902–928MHz, 2.4–2.5 GHz, 1575 MHz, and 1710–1880 MHz.

10. An asymmetric dipole antenna assembly according to claim 8, further comprising:

a second conductor trace disposed upon the first dielectric substrate, said second conductor trace coupled to the signal output to resonate at a frequency within either 2.4–2.5 GHz or at approximately 1575 MHz.

11. An asymmetric dipole antenna assembly for a handheld communications device having a transceiver circuit including a signal output and a ground plane, said antenna assembly comprising:

a first dipole half including a first conductor trace disposed upon a first dielectric substrate, said first conductor trace having a first end and an electrical length of approximately one quarter of a predetermined wavelength, said first conductor trace being operatively coupled to the ground plane proximate the first ends said first dipole half being disposed near an upper portion of the hand-held communications device and away from a user's hand during operation;

a second dipole half including a second conductor trace disposed upon a second dielectric substrate, said second conductor trace being operatively coupled to the ground plane;

said first conductor trace being coupled a predetermined isolation distance away from the second conductor trace; and said first conductor trace being operatively coupled to the transceiver circuit signal output at a predetermined distance away from the first end.

12. An asymmetric dipole antenna assembly according to claim 11, wherein the first dielectric substrate is disposed in substantially perpendicular relationship to the second dielectric substrate.

13. An asymmetric dipole antenna assembly according to claim 11, wherein the predetermined distance is approximately 0.03 times the predetermined wavelength.

14. An asymmetric dipole antenna assembly according to claim 11, wherein the first conductor trace includes first conductor trace portions having different widths.

15. An asymmetric dipole antenna assembly according to claim 11, wherein the first conductor trace is disposed upon a major surface of the first dielectric substrate directed away from the transceiver circuit.

16. An asymmetric dipole antenna assembly according to claim 11, wherein said first dipole half further includes a plurality of conductor traces disposed upon a plurality of superimposed dielectric substrates each having a plated through hole, said plurality of conductor traces being operatively coupled via said plated through holes to define the first dipole half.

17. A dipole antenna assembly for a communications device, said device having a transceiver circuit and a ground plane, comprising:

a first dipole half including a first conductor trace disposed upon a major surface of a first dielectric substrate;

a second dipole half including a second conductor trace disposed upon a second dielectric substrate, said second conductor trace being operatively coupled to the ground plane, said second dielectric substrate having a peripheral edge;

said first conductor trace having an effective electrical length of one quarter of a predetermined wavelength, said first conductor trace having a first end and a plurality of trace portions having different trace widths;

said first conductor trace being operatively coupled to the ground plane proximate said first end and being operatively coupled to the transceiver circuit at a predetermined distance away from the first end along said first conductor trace; and said first conductor trace being disposed a predetermined isolation distance away from the second conductor trace proximate said peripheral edge.

18. A dipole antenna assembly according to claim 17, wherein the predetermined distance is approximately 0.03 times the predetermined wavelength.

19. A dipole antenna assembly according to claim 17, wherein the first dielectric substrate is disposed proximate an upper portion of the communications device during normal operation.

20. A dipole antenna assembly for a communications device, said device having a transceiver circuit and a ground plane, comprising:

a first dipole half including a first elongated conductor pattern disposed upon a major surface of a first dielectric substrate;

a second dipole half including a second conductor pattern disposed upon a second dielectric substrate, said second conductor pattern being operatively coupled to the ground plane, said second dielectric substrate having a peripheral edge;

said first conductor pattern having an effective electrical length of approximately one quarter of a predetermined wavelength, said first conductor pattern having a first end and a feedpoint disposed a predetermined distance away from said first end;

said first conductor pattern being operatively coupled to the ground plane at said first end and being operatively coupled to the transceiver circuit at the feedpoint; and said first dielectric substrate being disposed in substantially perpendicular relationship to the second dielectric substrate proximate said peripheral edge.

21. A dipole antenna assembly according to claim 20, wherein the predetermined distance is approximately 0.03 times the predetermined wavelength.

22. A dipole antenna assembly according to claim 20, wherein the first conductor pattern includes first conductor pattern portions having different widths.

23. A dipole antenna assembly according to claim 20, wherein the first conductor pattern is disposed upon a major surface of the first dielectric substrate directed away from the transceiver circuit.

24. A dipole antenna assembly according to claim 20, wherein the first dielectric substrate is substantially parallel to the second dielectric substrate.

25. An asymmetric dipole antenna assembly for a wireless communications device operating at a predetermined wavelength and having a transceiver circuit including a signal output and a ground plane, said transceiver circuit disposed upon a printed wiring board having a pair of opposed major surfaces including a first major surface directed away from a user during operation and a second major surface directed toward the user during operation, said ground plane disposed upon the printed wiring board, said antenna assembly comprising:

a first dipole half including a first conductor trace disposed upon a first dielectric substrate, said first dielectric substrate being aligned substantially parallel with the printed wiring board and disposed relative the first major surface of the printed wiring board, said first conductor trace having a first end and a one-quarter wavelength electrical length; said first conductor trace being operatively coupled proximate said first end to the ground plane of the transceiver circuit, and said first conductor trace being operatively coupled to the transceiver circuit signal output at a predetermined distance away from the first end; and a second dipole half including a second conductor trace disposed upon a second dielectric substrate, said second conductor trace being operatively coupled to the ground plane of the transceiver circuit, and said first conductor trace being disposed a predetermined isolation distance away from the second conductor trace.

26. An asymmetric dipole antenna assembly according to claim 25 wherein the predetermined isolation distance is less than 0.03 times the predetermined wavelength.

27. An asymmetric dipole antenna assembly according to claim 25, wherein the first conductor trace includes first conductor element portions having different widths.

28. An asymmetric dipole antenna assembly according to claim 25, wherein the first dielectric substrate is disposed proximate an upper portion of the communications device and away from a user's hand during normal operation.

29. An asymmetric dipole antenna assembly according to claim 25, wherein the signal output includes two different frequency bands of signal information, said two frequency bands selected from among the group including, 824–890 MHz, 860–890 MHz, 1710–1880 MHz, 1750–1870 MHz, 1850–1990 MHz, 902–928 MHz, 2.4–2.5 GHz, and 1575 MHz, and wherein separate portions of the first conductor trace resonate within the different two frequency bands during operation.

30. An assembly for a hand-held communications device, said assembly comprising:

a transceiver circuit including, a signal output and a ground plane, a first dipole half including a first conductor trace disposed upon a dielectric substrate, said first conductor trace having a first end and an electrical length of approximately one quarter of a predetermined wavelength, said first conductor trace being operatively coupled to the ground plane proximate the first end, said first dipole half being disposed near an upper portion of the hand-held communications device and away from a user's hand during operation, said first conductor trace being coupled a predetermined isolation distance away from the second conductor trace, and said first conductor trace being operatively coupled to the transceiver circuit signal output at a predetermined distance away from the first end; and a second dipole half including a second conductor trace disposed upon a second dielectric substrate, said second conductor trace being operatively coupled to the ground plane 31. An assembly according to claim 30, wherein the first dielectric substrate is disposed in substantially peipendicular relationship to the second dielectric substrate.

32. An assembly according to claim 30, wherein the first dielectric substrate is disposed in substantially parallel relationship to the second dielectric substrate.

33. An assembly according to claim 30, wherein the first conductor trace is disposed upon a major surface of the first dielectric substrate directed away from the transceiver circuit.

34. An assembly according to claim 30, wherein said first dipole half further includes a plurality of conductor traces disposed upon a plurality of superimposed dielectric substrates each having a plated through hole, said plurality of conductor traces being operatively coupled via said plated through holes to define the first dipole half.

* * * * *